(12) United States Patent
Ha et al.

(10) Patent No.: US 11,075,060 B2
(45) Date of Patent: Jul. 27, 2021

(54) SUBSTRATE PROCESSING APPARATUS

(71) Applicant: MOOHAN Co., Ltd., Gwangju-si (KR)

(72) Inventors: Eun Geu Ha, Daegu (KR); Sung Kook Kim, Gumi-si (KR); Hyun O Kim, Seoul (KR); Il Young Park, Gwangju-si (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 301 days.

(21) Appl. No.: 14/648,247

(22) PCT Filed: Dec. 26, 2013

(86) PCT No.: PCT/KR2013/012194
§ 371 (c)(1),
(2) Date: May 28, 2015

(87) PCT Pub. No.: WO2014/104751
PCT Pub. Date: Jul. 3, 2014

(65) Prior Publication Data
US 2015/0303037 A1    Oct. 22, 2015

(30) Foreign Application Priority Data

Dec. 27, 2012 (KR) ........................ 10-2012-0154918

(51) Int. Cl.
*H01J 37/32* (2006.01)
*C23C 16/509* (2006.01)
(Continued)

(52) U.S. Cl.
CPC ...... *H01J 37/32541* (2013.01); *C23C 16/452* (2013.01); *C23C 16/455* (2013.01);
(Continued)

(58) Field of Classification Search
CPC ............. H01J 37/3244; H01J 37/32541; H01J 37/32449; H01J 37/32532;
(Continued)

(56) References Cited

U.S. PATENT DOCUMENTS 6,148,761 A * 11/2000 Majewski ......... H01L 21/67011
118/715
6,353,201 B1 * 3/2002 Yamakoshi ....... H01J 37/32082
118/723 I
(Continued)

FOREIGN PATENT DOCUMENTS

CN         1806317 A        7/2006
CN       101003033 A        7/2007
(Continued)

OTHER PUBLICATIONS

English Machine Translation of KR10-2011-0104847A Description.*
(Continued)

*Primary Examiner* — Rakesh K Dhingra
*Assistant Examiner* — Laureen Chan
(74) *Attorney, Agent, or Firm* — Andrew D. Fortney; Central California IP Group, P.C.

(57) ABSTRACT

Disclosed is an apparatus for processing substrate which prevents a plasma discharge from being transferred to a substrate so as to minimize damages on the substrate and also minimize deterioration in quality of a thin film deposited on the substrate, wherein the apparatus may include a process chamber for providing a reaction space, and a gas distribution module for dissociating processing gas by the use of plasma, and distributing the dissociated processing gas onto a substrate, wherein the gas distribution module may include a lower frame having a plurality of electrode inserting portions, an upper frame having a plurality of
(Continued)

protruding electrodes and processing gas distribution holes, and an insulating plate having a plurality of electrode penetrating portions.

20 Claims, 11 Drawing Sheets

(51) Int. Cl.
*C23C 16/452* (2006.01)
*C23C 16/455* (2006.01)
*C23C 16/50* (2006.01)

(52) U.S. Cl.
CPC .. *C23C 16/45565* (2013.01); *C23C 16/45574* (2013.01); *C23C 16/50* (2013.01); *C23C 16/5096* (2013.01); *H01J 37/3244* (2013.01); *H01J 37/32091* (2013.01)

(58) Field of Classification Search
CPC ........... H01J 37/32568; H01J 2237/327; H01J 2237/3322; H01J 2237/3323; H01J 2237/3325; H01J 2237/334; H01J 2237/3343; H01J 37/32082; H01J 37/32091; H01J 37/32807; C23C 16/5096; C23C 16/455; C23C 16/45512; C23C 16/45514; C23C 16/45561; C23C 16/45563; C23C 16/45565; C23C 16/50; C23C 16/505; C23C 16/509; H05H 1/46; H05H 2001/4645; H05H 2001/4675
See application file for complete search history.

(56) References Cited

U.S. PATENT DOCUMENTS

| | | | |
|---|---|---|---|
| 7,834,332 B2 | 11/2010 | Lee et al. | |
| 2005/0126487 A1* | 6/2005 | Tabuchi | C23C 16/24 118/723 E |
| 2006/0288934 A1* | 12/2006 | Takahashi | C23F 4/00 118/715 |
| 2007/0095284 A1 | 5/2007 | Iizuka et al. | |
| 2007/0148560 A1 | 6/2007 | Lee et al. | |
| 2007/0163440 A1* | 7/2007 | Kim | C23C 16/45565 96/52 |
| 2009/0169744 A1* | 7/2009 | Byun | C23C 16/40 427/255.28 |
| 2010/0323501 A1* | 12/2010 | Yamazaki | H01J 37/3244 438/479 |
| 2011/0039402 A1* | 2/2011 | Yamazaki | C23C 16/24 438/488 |
| 2011/0088847 A1* | 4/2011 | Law | H01J 37/32449 156/345.34 |
| 2011/0214812 A1* | 9/2011 | Song | B23P 17/00 156/345.33 |
| 2012/0021561 A1* | 1/2012 | Terakawa | C23C 14/3414 438/98 |
| 2013/0012006 A1 | 1/2013 | Yamazaki et al. | |
| 2014/0141619 A1* | 5/2014 | Sawada | H01J 37/32165 438/711 |

FOREIGN PATENT DOCUMENTS

| | | | |
|---|---|---|---|
| JP | 4292002 B2 * | 7/2009 | |
| JP | 2010-153531 A | 7/2010 | |
| JP | 4601104 B2 * | 12/2010 | |
| JP | 2011-23714 A | 2/2011 | |
| KR | 10-0672256 B1 | 1/2007 | |
| KR | 10-2007-0021687 A | 2/2007 | |
| KR | 100752525 B1 * | 8/2007 | |
| KR | 20090066996 A * | 6/2009 | |
| KR | 20110104847 A * | 9/2011 | |
| KR | 1020110104847 A | 9/2011 | |
| KR | 10-1160906 B1 | 6/2012 | |
| KR | 20120119903 A * | 10/2012 | |

OTHER PUBLICATIONS

English Machine Translation of JP2010153531 Description retrieved Nov. 24, 2017.*
English Machine Translation of KR20120119903A Description retrieved Nov. 20, 2017 (Year: 2012).*
English Machine Translation of Wi (KR-20090066996-A) retrieved from ESPACENET Apr. 14, 2020 (Year: 2020).*
English Machine Translation of Kasahara et al. JP4292002 B2 retrieved from ESPACENET Oct. 6, 2020 (Year: 2020).*
English Machine Translation of Snil JP4601104 B2 retrieved from ESPACENET Oct. 6, 2020 (Year: 2020).*
English Machine Translation of Kim et al. (KR-100752525-B1) retrieved from ESPACENET on Mar. 25, 2021 (Year: 2021).*
International Search Report with English translation dated Mar. 20, 2014 for International Application No. PCT/KR2013/012194.
Abstract of KR 1020110104847 (A); "Capacitively Coupled Plasma Reactor Capable of Uniformly Generating and Maintaining Large-Sized Plasma"; Sep. 23, 2011; Dai Kyu Choi; http://kpa.kipris.or.kr.
Abstract of KR 1020070021687 (A); "Structure of Vacuum Chamber Capable of Enhancing Plasma Uniformity and Preventing Drop of Self DC Bias Voltage"; Feb. 23, 2007; Yong Taek Eom and Hun Cha; http://kpa.kipris.or.kr.
Bibliographic Data of JP2010153531 (A); Jul. 8, 2010; "Apparatus of Manufacturing Semiconductor"; Mitsuaki Tanabe and Sadayoshi Horii ; 2 pgs.; http://worldwide.espace.net.com.
Bibliographic Data of JP2011023714 (A); Feb. 3, 2011; "Plasma Treatment Apparatus, Method for Forming Film, and Method for Manufacturing Thin-Film Transistor"; Shunpei Yamazaki, Takayuki Inoue, Erumu Kikuchi and Hirotaka Inoue; 2 pgs.; http://worldwide.espace.net.com.
Bibliographic Data of KR100672256 (B1); Jan. 24, 2007; "Pattern Forming Device and Method Thereof"; Chang Bok Lee and Jung Woong Son; http://worldwide.espace.net.com.
Iizuka Yashiro et al.; Gas Processing Apparatus and Film-Forming Apparatus; Bibliographic Data of CN1806317 A; Jul. 19, 2006; http://worldwide.espacenet.com.
Choi Dai Kyu; Capacitively Coupled Plasma Reactor; Bibliographic Data of KR10-2011-0104847 A; Sep. 23, 2011; http://worldwide.espacenet.com.
Office Action dated Nov. 4, 2019; Chinese Pat. Appl. No. 201810448779.1; China Intellectual Property Administration, Beijing, China.
Kim Kyung S.; "Gas separation type showerhead"; Bibliographic data for CN101003033; Jul. 25, 2007; https://worldwide.espacenet.com.

* cited by examiner

SUBSTRATE PROCESSING APPARATUS

CROSS REFERENCE TO RELATED APPLICATIONS

This application claims the benefit of the Korean Patent Application No. 10-2012-0154918 filed on Dec. 27, 2012, which is hereby incorporated by reference as if fully set forth herein.

BACKGROUND

Field of the Invention

The present invention relates to an apparatus for processing substrate, and more particularly, to an apparatus for processing substrate which facilitates to improve a deposition uniformity of a thin film deposited on a substrate.

Discussion of the Related Art

Generally, in order to manufacture a solar cell, a semiconductor device and a flat panel display device, it is necessary to form a predetermined thin film layer, a thin film circuit pattern or an optical pattern on a surface of substrate. Thus, a semiconductor manufacturing process may be carried out, for example, a thin film deposition process of depositing a thin film of a predetermined material on a substrate, a photo process of selectively exposing the thin film by the use of photosensitive material, and an etching process of forming a pattern by selectively removing an exposed portion of the thin film.

The semiconductor manufacturing process is performed inside a substrate processing apparatus designed to be suitable for optimal circumstances. Recently, a substrate processing apparatus using plasma is generally used to carry out a deposition or etching process.

This semiconductor manufacturing process using plasma may be a PECVD (Plasma Enhanced Chemical Vapor Deposition) apparatus for forming a thin film, and a plasma etching apparatus for etching and patterning the thin film.

FIG. 1 illustrates an apparatus for processing substrate (substrate processing apparatus) according to the related art.

Referring to FIG. 1, the substrate processing apparatus according to the related art may include a chamber 10, a plasma electrode 20, a susceptor 30, and a gas distributing means 40.

The chamber 10 provides a reaction space for substrate processing. In this case, a predetermined portion of a bottom surface of the chamber 10 is communicated with an exhaust port 12 for discharging gas from the reaction space.

The plasma electrode 20 is provided over the chamber 10 so as to seal the reaction space.

One side of the plasma electrode 20 is electrically connected with a RF (Radio Frequency) power source 24 through a power cable. The RF power source 24 generates RF power, and supplies the generated RF power to the plasma electrode 20.

Also, a central portion of the plasma electrode 20 is communicated with a gas supply pipe 26 supplying processing gas for the substrate processing.

The susceptor 30 is provided inside the chamber 10, and the susceptor 30 supports a plurality of substrates (S) loaded from the external. The susceptor 30 corresponds to an opposite electrode in opposite to the plasma electrode 20, and the susceptor 30 is electrically grounded by a supporting axis 32 for supporting the susceptor 30. In this case, the supporting axis 32 is surrounded by a bellows 34 for sealing the supporting axis 32 and the bottom surface of the chamber 10.

The gas distributing means 40 is provided below the plasma electrode 20, wherein the gas distributing means 40 confronts the susceptor 30. In this case, a gas buffer space 42 is formed between the gas distributing means 40 and the plasma electrode 20, wherein the processing gas supplied from the gas supply pipe 26 penetrating through the plasma electrode 20 is supplied to the gas buffer space 42. The processing gas is produced by mixing source gas and reaction gas to form a predetermined thin film on the substrate (S), and the processing gas is supplied to the gas buffer space 42. The gas distributing means 40 uniformly distributes the processing gas to the entire area of the reaction space through a plurality of gas distributing holes 44 being communicated with the gas buffer space 42.

In case of the substrate processing apparatus according to the related art, after the substrate (S) is loaded onto the susceptor 30, the predetermined processing gas is distributed to the reaction space of the chamber 10, and the RF power is supplied to the plasma electrode 20 so as to form plasma discharge (P) between the gas distributing means 40 and the susceptor 30, whereby molecules of the processing gas ionized by the plasma discharge (P) are deposited on the substrate (S), to thereby form the predetermined thin film on the substrate (S).

However, in case of the substrate processing apparatus according to the related art, the space for distributing the processing gas is the same as the space for forming the plasma discharge (P). Thus, the plasma discharge (P) occurs above the substrate (S), whereby the substrate (S) may be damaged by the plasma discharge (P), thereby deteriorating quality of the thin film on the substrate (S). Also, in case of the substrate processing apparatus according to the related art, the processing gas ionized by the plasma discharge (P) may be deposited adjacent to the gas distributing holes 44, whereby an abnormal thin film of powder components may be formed, and furthermore, particles of the abnormal thin film may fall down on the substrate (S).

SUMMARY

Accordingly, the present invention is directed to an apparatus for processing substrate that substantially obviates one or more problems due to limitations and disadvantages of the related art.

An aspect of the present invention is to provide an apparatus for processing substrate, which prevents a plasma discharge from being transferred to a substrate so as to minimize damages on the substrate and also minimize deterioration in quality of a thin film deposited on the substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a substrate processing apparatus that may include a process chamber for providing a reaction space; a gas distribution module for dissociating processing gas by the use of plasma, and distributing the dissociated processing gas onto a substrate, wherein the gas distribution module is provided in the process chamber, wherein the gas distribution module includes a lower frame having a plurality of electrode inserting portions; an upper frame having a plurality of protruding electrodes respectively inserted into the plurality of electrode inserting portions so as to provide a gap space, and a plurality of processing gas distribution holes formed in the plurality of protruding electrodes so as to distribute the processing gas onto the substrate; and an insulating plate, formed between the lower frame and the upper frame, having a plurality of electrode penetrating portions, wherein the plurality of protruding electrodes penetrating through the electrode penetrating portions are respectively inserted into the plurality of electrode inserting portions.

At this time, the upper frame, the insulating plate and the lower frame are formed as one module.

An interval between the protruding electrode and the electrode inserting portion may be smaller than an interval between a lower surface of the protruding electrode and the substrate.

Also, the upper frame overlapping with the gap space is provided with a plurality of dilution gas distribution holes which distribute dilution gas for forming the plasma to the gap space.

Also, the upper frame is electrically grounded, and the plasma is generated by the dilution gas distributed to the gap space through the plurality of dilution gas distribution holes, and plasma power supplied to the lower frame.

The lower frame is electrically grounded, and the plasma is generated by the dilution gas distributed to the gap space through the plurality of dilution gas distribution holes, and plasma power supplied to the upper frame.

An interval between the substrate and a lower surface of each of the protruding electrodes may be the same as or different from an interval between the substrate and a lower surface of the lower frame.

Each of the electrode inserting portions has a circle or polygonal shaped cross section, and each protruding electrode whose cross section is the same as that of the electrode inserting portion is surrounded by the electrode inserting portion.

The plurality of electrode inserting portions are arranged in a lattice configuration.

The plurality of electrode inserting portions are arranged at fixed intervals in each of 'n' columns, and the plurality of electrode inserting portions arranged in the odd-numbered column and the even-numbered column are staggered.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

On explanation about the embodiments of the present invention, the following details about the terms should be understood.

The term of a singular expression should be understood to include a multiple expression as well as the singular expression if there is no specific definition in the context. If using the term such as "the first" or "the second", it is to separate any one element from other elements. Thus, a scope of claims is not limited by these terms.

Also, it should be understood that the term such as "include" or "have" does not preclude existence or possibility of one or more features, numbers, steps, operations, elements, parts or their combinations.

It should be understood that the term "at least one" includes all combinations related with any one item. For example, "at least one among a first element, a second element and a third element" may include all combinations of the two or more elements selected from the first, second and third elements as well as each element of the first, second and third elements.

Also, if it is mentioned that a first element is positioned "on or above" a second structure, it should be understood that the first and second elements may be brought into contact with each other, or a third element may be interposed between the first and second elements.

Hereinafter, an apparatus for processing substrate (substrate processing apparatus) according to the embodiment of the present invention will be described with reference to the accompanying drawings.

Figure 1:
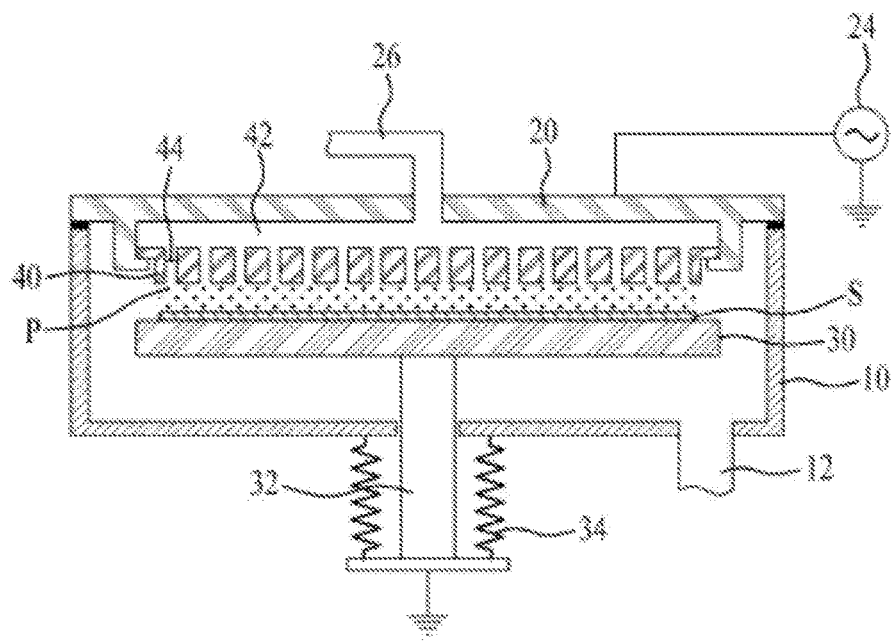
FIG. 1 illustrates a substrate processing apparatus according to the related art.
Figure 2:
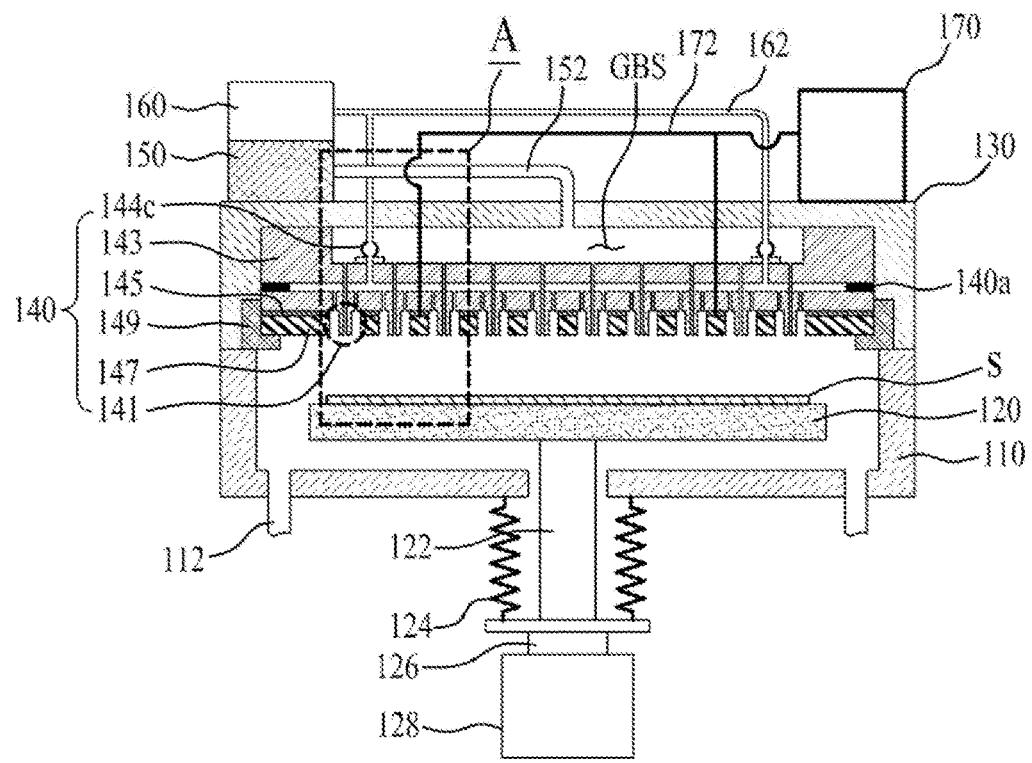
FIG. 2 illustrates a substrate processing apparatus according to the first embodiment of the present invention.
Figure 3:
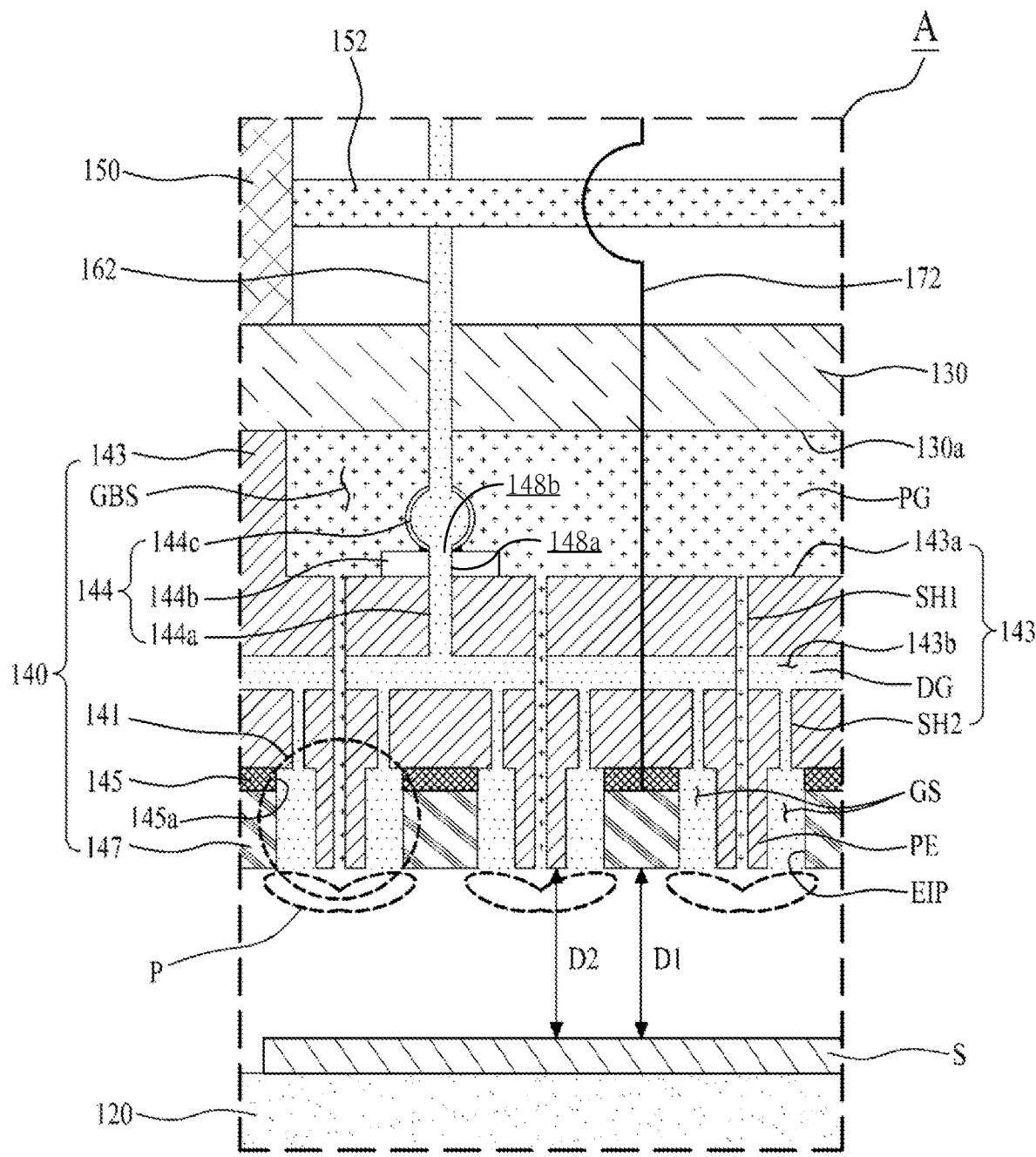
FIG. 3 is an expanded view illustrating 'A' portion shown in FIG. 2.
Figure 4:
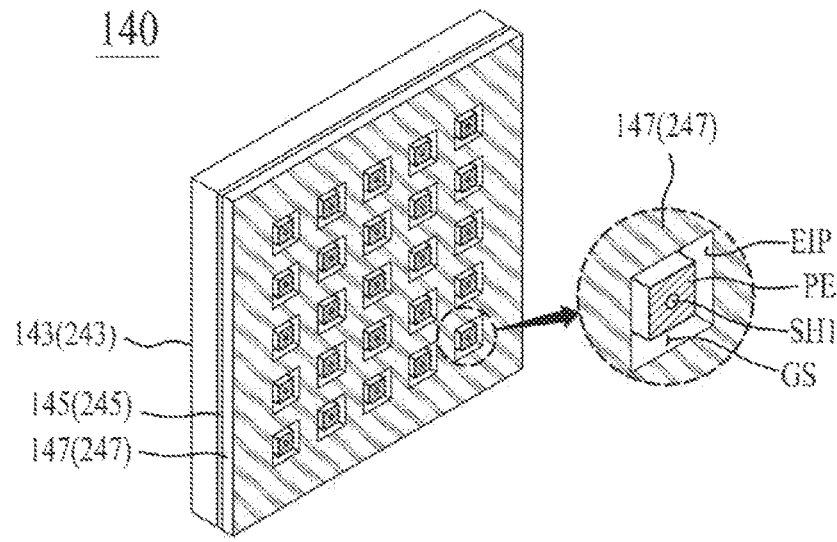
FIG. 4 illustrates a gas distribution module shown in FIG. 2.
Figure 5:
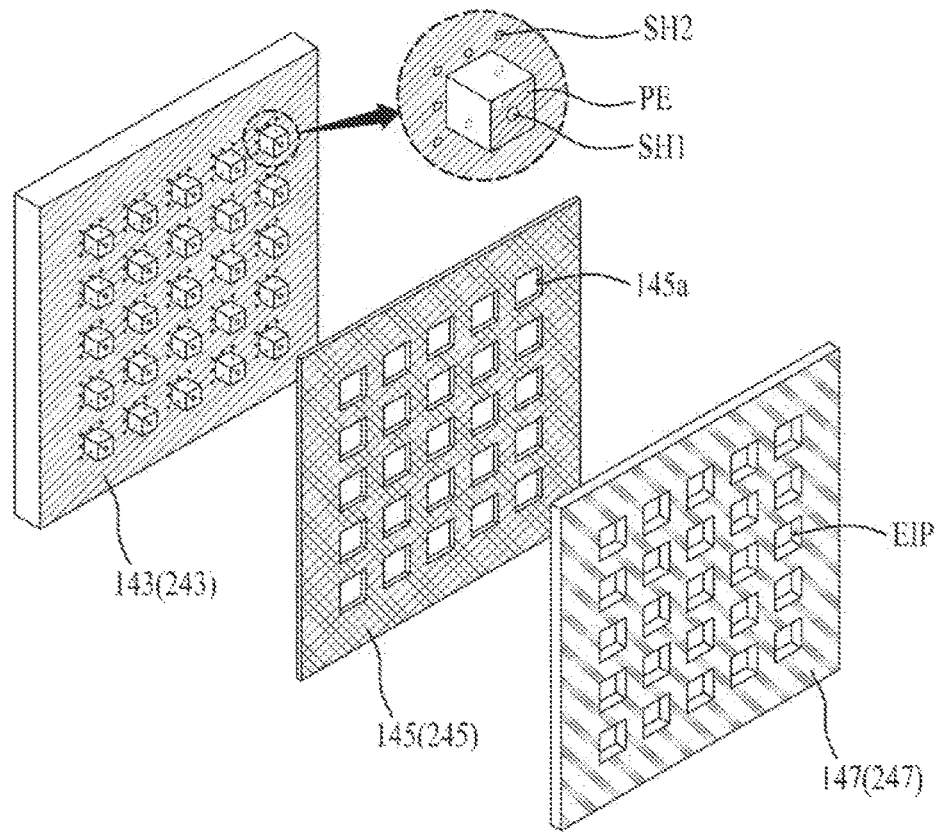
FIG. 5 is an exploded perspective view illustrating a gas distribution module shown in FIG. 4.

FIG. 2 illustrates a substrate processing apparatus according to the first embodiment of the present invention. FIG. 3 is an expanded view illustrating 'A' portion shown in FIG. 2. FIG. 4 illustrates a gas distribution module shown in FIG. 2. FIG. 5 is an exploded perspective view illustrating a gas distribution module shown in FIG. 4.

Referring to FIGS. 2 to 5, the substrate processing apparatus according to the first embodiment of the present invention may include a process chamber 110, a substrate supporter 120, a chamber lid 130, and a gas distribution module 140. The process chamber 110 provides a reaction space for substrate processing. The substrate supporter 120 for supporting a substrate (S) is provided inside the process chamber 110. The chamber lid 130 is provided over the process chamber 110, that is, the chamber lid 130 covers the process chamber 110. The gas distribution module 140 is provided with a plurality of plasma discharge cells 141 detachably combined with a lower surface of the chamber lid 130 confronting the substrate supporter 120, wherein the plurality of plasma discharge cells 141 dissociate a processing gas by the use of plasma, and distributes the processing gas onto the substrate (S).

The process chamber 110 provides the reaction space for substrate processing (for example, thin film deposition process). In this case, a bottom surface and/or lateral surface of the process chamber 10 may be communicated with an exhaust port 112 for discharging gas from the reaction space.

The substrate supporter 120 is provided inside the process chamber 110. The substrate supporter 120 may support the plurality of substrates (S) or one large-sized substrate (S). In this case, a size for each of the plurality of substrates (S) may be ¼ of one-large sized substrate.

The substrate supporter 120 may be electrically floating or grounded. The substrate supporter 120 is supported by a supporting axis 122 penetrating through a central portion of the bottom surface of the process chamber 110. In this case, the supporting axis 122 exposed out of the bottom surface of the process chamber 110 is sealed by a bellows 124 provided in the bottom surface of the process chamber 110.

The substrate supporter 120 may be elevated in accordance with the process conditions of the substrate processing. In this case, the supporting axis 122 of the substrate supporter 120 is supported by a driving axis 126 of a driving apparatus 128. Accordingly, an upper surface of the substrate supporter 120 may be relatively close to or distant from a lower surface of the gas distribution module 140 within the process conditions of the substrate processing by elevating of the driving axis 126 in accordance with the driving of driving apparatus 128. If needed, the substrate supporter 120 may be rotated by the driving of driving apparatus 128.

The chamber lid 130 is provided to cover the process chamber 110, to thereby seal the reaction space. The chamber lid 130 supports the gas distribution module 140. To this end, the chamber lid 130 has "⊓" shaped cross section so that the gas distribution module 140 is inserted into and also detachably connected with the chamber lid 130.

On an upper surface of the chamber lid 130, there are first and second gas suppliers 150 and 160 which are provided to individually supply processing gas (PG) and dilution gas (DG) to each of the plurality of plasma discharge cells 141 prepared in the gas distribution module 140, and a plasma power supplier 170 for supplying plasma power to form plasma (P) in each of the plurality of plasma discharge cells 141.

The first gas supplier 150 supplies the processing gas (PG) to the plurality of plasma discharge cells 141. For example, the processing gas (PG) may be gas including material of silicon (Si), titanium family element (Ti, Zr, Hf, and etc.), or aluminum (Al). In this case, the processing gas (PG) including the material of silicon (Si) may be Silane (SiH4), Disilane (Si2H6), Trisilane (Si3H8), TEOS (Tetraethylorthosilicate), DCS (Dichlorosilane), HCD (Hexachlorosilane), TriDMAS (Tri-dimethylaminosilane), TSA (Trisilylamine), and etc.

The second gas supplier 160 supplies the dilution gas (DG) to the plurality of plasma discharge cells 141. For example, the dilution gas (DG) may be hydrogen (H2), nitrogen (N2), oxygen (O2), nitrogen dioxide (NO2), ammonia (NH3), water (H2), or ozone (O3). In this case, the second gas supplier 160 may mix the dilution gas (DG) with non-reaction gas such as argon (Ar), xenon (Ze) or helium (He), and supply the mixed gas to the plurality of plasma discharge cells 141.

The plasma power supplier 170 generates the plasma power to form the plasma (P) for each of the plurality of plasma discharge cells 141, and supplies the generated plasma power to the gas distribution module 140. In this case, the plasma power may be high frequency (HF) power or radio frequency (RF) power, for example, low frequency (LF) power, middle frequency (MF) power, high frequency (HF) power, or very high frequency (VHF) power. The LF power may have a frequency range of 3 kHz~300 kHz, the MF power may have a frequency range of 300 kHz~3 MHz, the HF power may have a frequency range of 3 MHz~30 MHz, and the VHF power may have a frequency range of 30 MHz~300 MHz.

The plasma power supplier 170 may include an impedance matching circuit (not shown) for matching load impedance and source impedance of the plasma power supplied to a protruding electrode (PE). The impedance matching circuit may include at least two of impedance element (not shown) formed of at least one of variable capacitor and variable inductor.

The gas distribution module 140 is detachably connected with the lower surface of the chamber lid 130, whereby the gas distribution module 140 confronts the substrate supporter 120. The gas distribution module 140 includes the plurality of plasma discharge cells 141 which generate the plasma (P) in accordance with the dilution gas (DG) supplied from the second gas supplier 160 and the plasma power supplied from the plasma power supplier 170, and distribute the processing gas (PG) supplied from the first gas supplier 150 to a plasma area for forming the plasma (P) so as to distribute the processing gas (PG) dissociated by the plasma (P) onto the substrate (S). To this end, the gas distribution module 140 may include an upper frame 143, a plurality of dilution gas common supply members 144, an insulating plate 145, a lower frame 147, and an insulator 149.

The upper frame 143 is detachably connected with the lower surface 130a of the chamber lid 130, and is provided at a predetermined interval from the lower surface 130a of the chamber lid 130. Accordingly, a processing gas buffer space (GBS) is prepared between an upper surface 143a of the upper frame 143 and the lower surface 130a of the chamber lid 130, wherein the processing gas (PG) supplied from the first gas supplier 150 through a first gas supply pipe 152 is diffused and buffered in the processing gas buffer space (GBS). To this end, the upper surface 143a of the upper frame 143 may have a stepped portion provided at a predetermined interval from the lower surface 130a of the chamber lid 130. The upper frame 143 may be formed of a metal material such as aluminum (Al), whereby the upper frame 143 may be electrically grounded through the chamber lid 130.

The upper frame 143 may include the plurality of protruding electrodes (PE), a plurality of processing gas distribution holes (SH1), a plurality of dilution gas supply holes 143b, and a plurality of dilution gas distribution holes (SH2).

Each of the plurality of protruding electrodes (PE) protrudes from a lower surface of the upper frame 143 toward the substrate (S) so that each protruding electrode (PE) corresponds to each of the plurality of plasma discharge cells 141. Each of the plurality of protruding electrodes (PE) may have a cross section of circular shape or polygonal shape. For example, each of the plurality of protruding electrodes (PE) may be formed in a cylinder shape or a polygonal pillar shape of square pillar.

In order to prevent or minimize arching at each corner in each of the plurality of protruding electrodes (PE), each corner may be rounded with a predetermined curvature.

Each of the plurality of processing gas distribution holes (SH1), which penetrates through the protruding electrode (PE), is communicated with the processing gas buffer space (GBS). Accordingly, each of the plurality of processing gas distribution holes (SH1) downwardly distributes the processing gas (PG) supplied to the processing gas buffer space (GBS) toward the lower surface of the protruding electrode (PE). In this case, the distributed processing gas (PG) widely spreads to the plasma area from the lower surface of the protruding electrode (PE).

Figure 13:
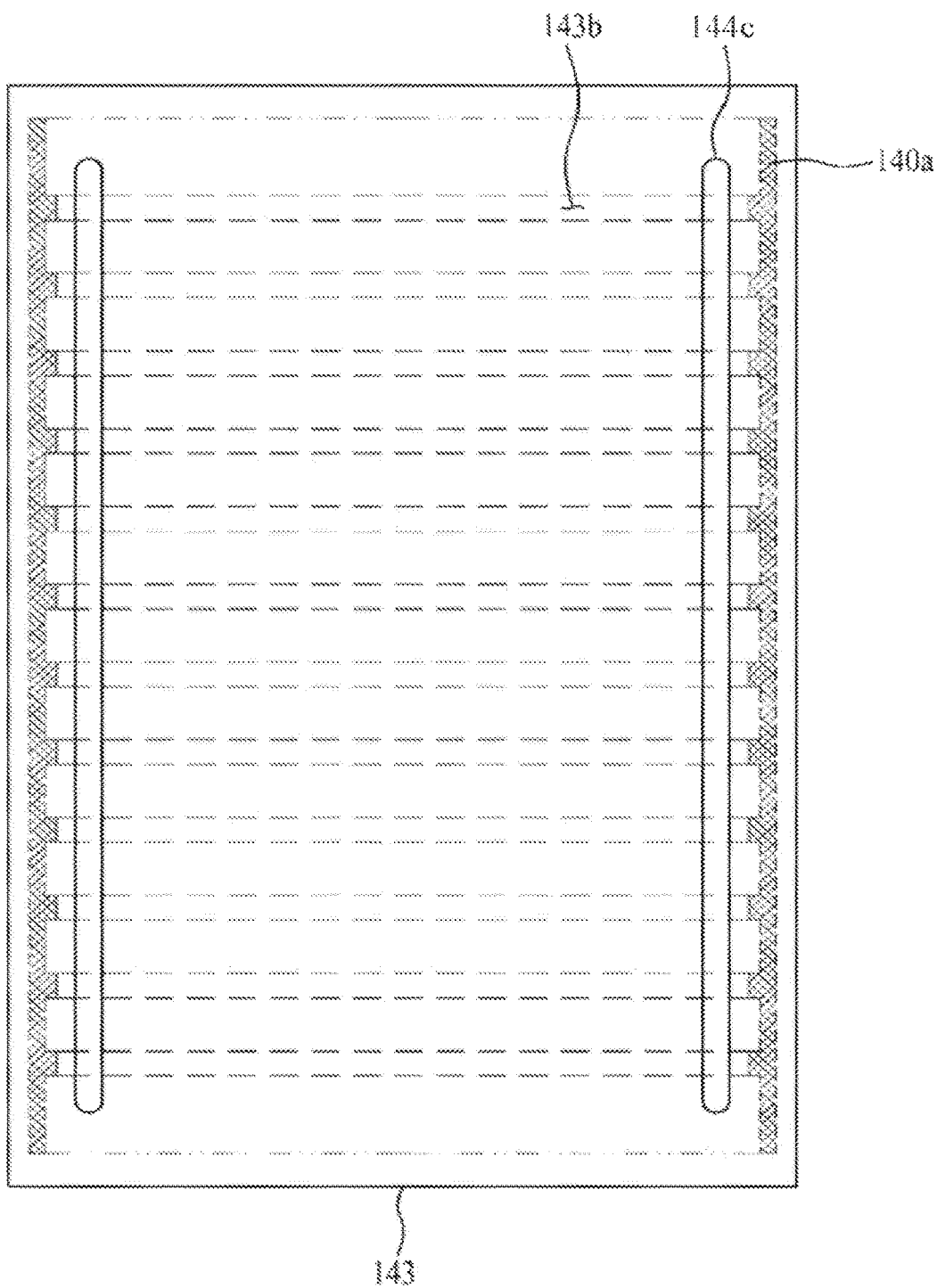
FIG. 13 is a plan view of the upper frame 143, the dilution gas common supply pipe 144c of the dilution gas common supply members 144, and dilution gas supply holes 143b.

The plurality of dilution gas supply holes 143b overlapping with the plurality of plasma discharge cells 141 are provided inside the upper frame 143, wherein the plurality of dilution gas supply holes 143b are arranged in parallel, and provided at fixed intervals with the protruding electrodes (PE) respectively interposed in-between. The plurality of dilution gas supply holes 143b are connected with the plurality of dilution gas common supply members 144, whereby the dilution gas (DG) supplied from the plurality of dilution gas common supply members 144 is supplied to the plurality of dilution gas distribution holes (SH2). FIG. 13 shows a plan view of the upper frame 143, the dilution gas common supply members 144, and dilution gas supply holes 143b. According to an arrangement structure of the plasma discharge cells 141, the plurality of dilution gas supply holes 143b are formed in a linear shape penetrating through a vertical direction of the upper frame 143, and then both ends of the linear shape including the plurality of dilution gas supply holes 143b are sealed by a sealing process 140a, whereby the plurality of dilution gas supply holes 143b are arranged at fixed intervals inside the upper frame 143.

Each of the plurality of dilution gas distribution holes (SH2), which penetrates through the upper frame 143 corresponding to the circumference of the protruding electrode (PE), is communicated with each of the plurality of dilution gas supply holes 143b. In this case, at least two dilution gas distribution holes (SH2) are formed in the circumference of both sides of the protruding electrode (PE) for each of the plurality of plasma discharge cells 141.

The plurality of dilution gas common supply members 144, which are provided on the upper surface of the upper frame 143, are communicated with the plurality of dilution gas supply holes 143b in common, and also connected with a second gas supply pipe 162 of the second gas supplier 160. To this end, the plurality of dilution gas common supply members 144 may include a plurality of dilution gas division holes 144a, a common block 144b, and a dilution gas common supply pipe 144c.

Each of the plurality of dilution gas division holes 144a penetrates through the upper frame 143, whereby each of the plurality of dilution gas division holes 144a is communicated with both sides of each of the dilution gas supply holes 143b.

The common block 144b, which is provided on the upper surface of the upper frame 143, crosses both sides of each of the dilution gas supply holes 143b, to thereby seal the plurality of dilution gas division holes 144a. The common block 144b is provided with a plurality of communication holes 148a which are communicated with the respective dilution gas division holes 144a.

The dilution gas common supply pipe 144c is connected with the common block 144b while being provided in parallel to a longitudinal direction of the common block 144b. Also, the dilution gas common supply pipe 144c is connected with the second gas supply pipe 162 of the second gas supplier 160. On the lower surface of the dilution gas common supply pipe 144c, there may be a plurality of lower holes 148b communicated with the plurality of communication holes 148a formed in the common block 144b. At least one upper hole connected with the second gas supply pipe 162 may be formed on the upper surface of the dilution gas common supply pipe 144c. The dilution gas (DG) is supplied from the second gas supplier 160 to the dilution gas common supply pipe 144c through the second gas supply pipe 162, and then the dilution gas common supply pipe 144c supplies the dilution gas (DG) to the plurality of dilution gas supply holes 143b through the communication holes 148a of the common block 144b, whereby the dilution gas (DG) is distributed to the circumference of both sides of the protruding electrode (PE) for each of the plurality of plasma discharge cells 141 through the plurality of dilution gas supply holes 143b and the plurality of dilution gas distribution holes (SH2).

The insulating plate 145 is detachably connected with the lower surface of the upper frame 143 so as to cover the remaining lower surface areas except the plurality of protruding electrodes (PE) and the plurality of dilution gas distribution holes (SH2). In this case, the insulating plate 145 is provided with a plurality of electrode penetrating portions 145a. The plurality of protruding electrodes (PE), which protrude from the lower surface of the upper frame 143, are respectively inserted into the plurality of electrode penetrating portions 145a, and then penetrate through the plurality of electrode penetrating portions 145a. Each of the electrode penetrating portions 145a, formed in a circle or polygonal shape which is the same as that of the protruding electrode (PE), surrounds the protruding electrode (PE). The insulating plate 145 is formed of an insulating material, for example, ceramic material, to thereby electrically insulate the upper frame 143 and the lower frame 147 from each other.

The lower frame 147 is provided with a plurality of electrode inserting portions (EIP) into which the plurality of protruding electrodes (PE) penetrating through the electrode penetrating portions 145a of the insulating plate 145 are inserted, and the lower frame 147 is detachably connected with the lower surface of the insulating plate 145. In this case, the plurality of electrode inserting portions (EIP), into which the plurality of protruding electrodes (PE) penetrating through the electrode penetrating portion 145a of the insulating plate 145 are inserted, are formed in the lower frame 147, and each of the electrode inserting portions (EIP) is formed in a circle or polygonal shape which is the same as that of the protruding electrode (PE) so as to surround each lateral surface of the protruding electrode (PE).

An inner lateral surface of each of the electrode inserting portions (EIP) is provided at a predetermined interval from an outer lateral surface of the protruding electrode (PE), to thereby prepare a predetermined gap space (GS) therebetween. Thus, the electrode inserting portion (EIP) functions as a ground electrode which confronts each lateral surface of the protruding electrode (PE). In the predetermined gap space (GS) prepared between the inner lateral surface of each of the electrode inserting portions (EIP) and the outer lateral surface of the protruding electrode (PE), there are the plurality of dilution gas distribution holes (SH2) through which the dilution gas (DG) is distributed to the gap space (GS).

The lower frame 147, which is electrically insulated from the upper frame 143, is inserted into and is electrically connected with a plasma power supply member (not shown) penetrating through the insulating plate 145. Accordingly, the aforementioned plasma power is supplied from the plasma power supplier 170 to the lower frame 147 through the plasma power supply member and plasma power cable 172.

The electrode inserting portion (EIP) of the lower frame 147, the protruding electrode (PE) inserted into the electrode inserting portion (EIP), and the gap space (GS) constitute one plasma discharge cell 141. Thus, the plurality of plasma discharge cells 141 are provided on the lower surface of the lower frame 147, and are arranged in a lattice or zigzag configuration in accordance with the arrangement structure of the plurality of electrode inserting portions (EIP), wherein the plurality of plasma discharge cells 141 confront the upper surface of the substrate (S). For each of the plurality of plasma discharge cells 141, the plasma (P) occurs in the lower circumference of the gap space (GS) or protruding electrode (PE) by the dilution gas (DG) supplied to the gap space (GS) between the inner lateral surface of the electrode inserting portion (EIP) and the outer lateral surface of the protruding electrode (PE) and the plasma power supplied to the lower frame 147, and the processing gas (PG) is distributed to the plasma area for forming the plasma (P) through the processing gas distribution hole (SH1) of the protruding electrode (PE), whereby the processing gas (PG) is dissociated by the plasma (P), and is then downwardly distributed onto the substrate (S), to thereby form a predetermined thin film layer. That is, a dissociation gas radical is produced in the plurality of plasma discharge cells 141 by the plasma (P) occurring in the gap space (GS), and then the dissociation gas radical is distributed onto the substrate (S), whereby the dissociation gas radical meets with the processing gas (PG) distributed through the processing gas distribution hole (SH1) of the protruding electrode (PE), to thereby dissociate the processing gas (PG). Accordingly, the dissociated processing gas (PG) and the dissociation gas radical are downwardly distributed and then chemically combined on the substrate (S), to thereby form the thin film on the upper surface of the substrate (S).

A first distance (D1) between the lower surface of the lower frame 147 and the upper surface of the substrate (S) may be the same as or different from a second distance (D2) between the lower surface of the protruding electrode (PE) and the upper surface of the substrate (S).

According to one embodiment of the present invention, the first distance (D1) may be the same as the second distance (D2). In this case, the lower surface of the protruding electrode (PE) and the lower surface of the lower frame 147 may be positioned in the same horizontal plane.

According to another embodiment of the present invention, the first distance (D1) may be different from the second distance (D2). In this case, the protruding electrode (PE) may have a length which is larger than a total thickness of the insulating plate 145 and the lower frame 147 so that the protruding electrode (PE) protrudes out of the lower surface of the lower frame 147 toward the upper surface of the substrate (S), or may have a length which is smaller than a total thickness of the insulating plate 145 and the lower frame 147 so that the protruding electrode (PE) does not protrude out of the lower surface of the lower frame 147 toward the upper surface of the substrate (S).

According to another embodiment of the present invention, the first and second distances (D1, D2) may be differently set every plasma discharge cell 141. That is, if the plasma power is supplied to each of the plurality of plasma discharge cells 141, it is possible to uniformly maintain the plasma (P) for each of the plasma discharge cells 141. However, the plasma power is supplied to at least four contact positions of the aforementioned lower frame 147 due to a complicated structure of plasma power supply. Thus, the plasma power supplied to each of the plurality of plasma discharge cells 141 may be ununiform. In order to minimize this problem, a length of the protruding electrode (PE) formed in each of the plasma discharge cells 141 may be differently set every area so that the first and second distances (D1, D2) may be differently set every plasma discharge cell 141.

The first and second distances (D1, D2) may be set in accordance with the plasma area between the protruding electrode (PE) and the lower surface of the lower frame 147 and the deposition properties of the processing gas (PG). That is, as shown in FIG. 3, according to the embodiment of the present invention, the distance between the lower surface of the lower frame 147 and the protruding electrode (PE) is smaller than the distance (D1) between the lower surface of the lower frame 147 and the substrate (S) so that it is possible to overcome the problems caused by an abnormal plasma discharge. If the distance (D1) between the lower surface of the lower frame 147 and the substrate (S) is smaller than the distance between the lower surface of the lower frame 147 and the protruding electrode (PE), the abnormal plasma discharge might occur between the lower surface of the lower frame 147 and the substrate supporter 120 for supporting the substrate (S), whereby there may be a bad influence on the substrate (S).

The insulator 149 is connected with each side surface and a lower edge portion of the lower frame 147, and is also detachably connected with an inner side surface of the chamber lid 130. The insulator 149 is formed of an insulating material, for example, ceramic material. That is, the insulator 149 electrically insulates the chamber lid 130 and the lower frame 147 from each other.

The aforementioned upper frame 143, the insulating plate 145 and the lower frame 147 are formed as one module, which are detachably connected with the lower surface of the chamber lid 130.

A substrate processing method using the substrate processing apparatus according to the first embodiment of the present invention will be described as follows.

First, the plurality of substrates (S) or one large-sized substrate (S) may be loaded onto and placed on the substrate supporter 120.

Then, the dilution gas (DG) is supplied to the gap space (GS) for each of the plurality of plasma discharge cells 141 by the use of second gas supplier 160. Simultaneously, the plasma power is supplied to the lower frame 147 by the use of plasma power supplier 170. Accordingly, an electric field is formed in the gap space (GS) or lower space for each of the plurality of plasma discharge cells 141, to thereby form the plasma (P).

Together with the formation of plasma (P), the processing gas (PG) is supplied to the processing gas distribution hole (SH1) of the protruding electrode (PE) for each of the plurality of plasma discharge cells 141 by the use of first gas supplier 150, whereby the processing gas (PG) is distributed onto the substrate (S). Accordingly, the processing gas (PG) distributed onto the substrate (S) is dissociated by the plasma (P), whereby the dissociated processing gas (PG) is chemically combined with the radical generated from the dilution gas (DG) by the plasma (P), and is then deposited on the upper surface of the substrate (S), to thereby form the predetermined thin film layer.

In the substrate processing apparatus and method according to the first embodiment of the present invention, the processing gas (PG) is dissociated by the plasma (P) which occurs in each of the plurality of plasma discharge cells 141 arranged in the predetermined configuration inside the lower frame 147, and is distributed onto the substrate (S) so that it is possible to form the thin film with the uniform thickness on the entire upper surface of the substrate (S). In addition, it is possible to prevent the plasma discharge from being transferred to the substrate (S), to thereby minimize damages on the substrate (S) and the thin film formed on the substrate (S), and minimize deterioration in quality of the thin film. Furthermore, the processing gas (PG) and the dilution gas (DG) are separated from each other so that it is possible to minimize the abnormal thin film on the inside wall of the electrode inserting portion (EIP) and the protruding electrode (PE).

FIGS. 6 to 10 illustrate various shapes of plasma discharge cell according to the embodiment of the present invention.

Referring to FIGS. 6 to 10 in connection with FIG. 2, various shapes of plasma discharge cell according to the embodiment of the present invention will be described in detail as follows.

Figure 6:
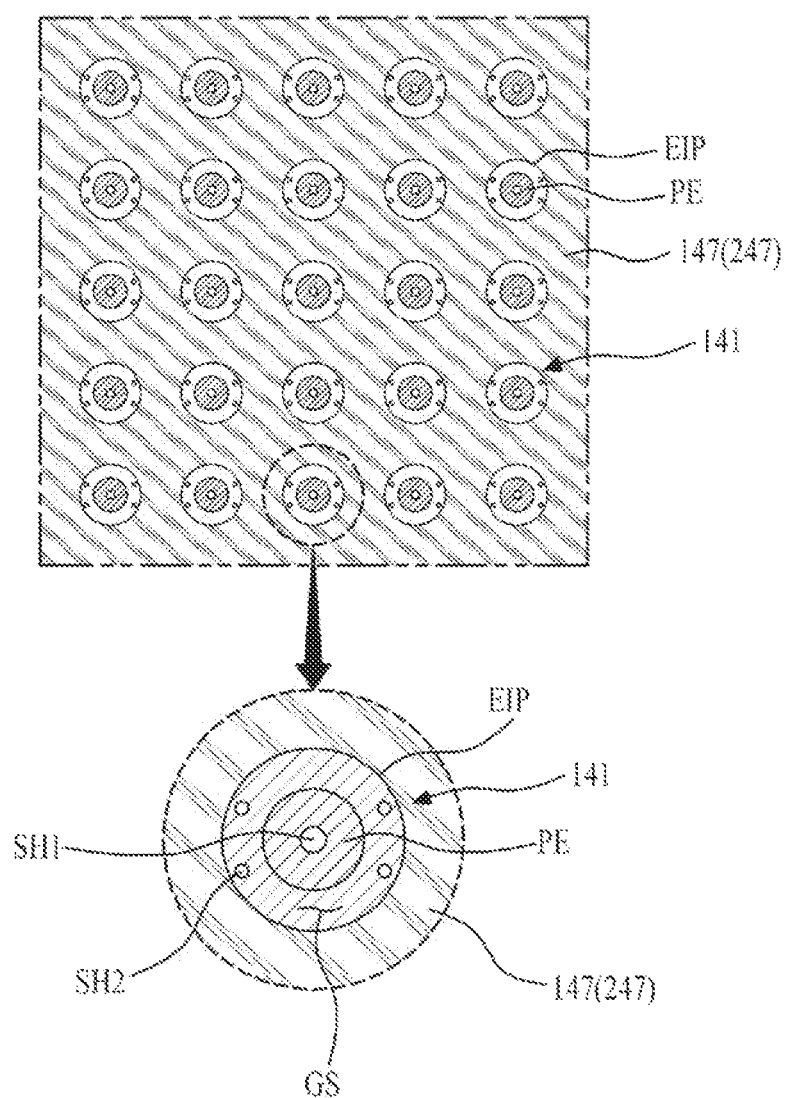
FIG. 6 illustrates a first arrangement structure of plasma discharging cells according to the embodiment of the present invention.
Figure 7:
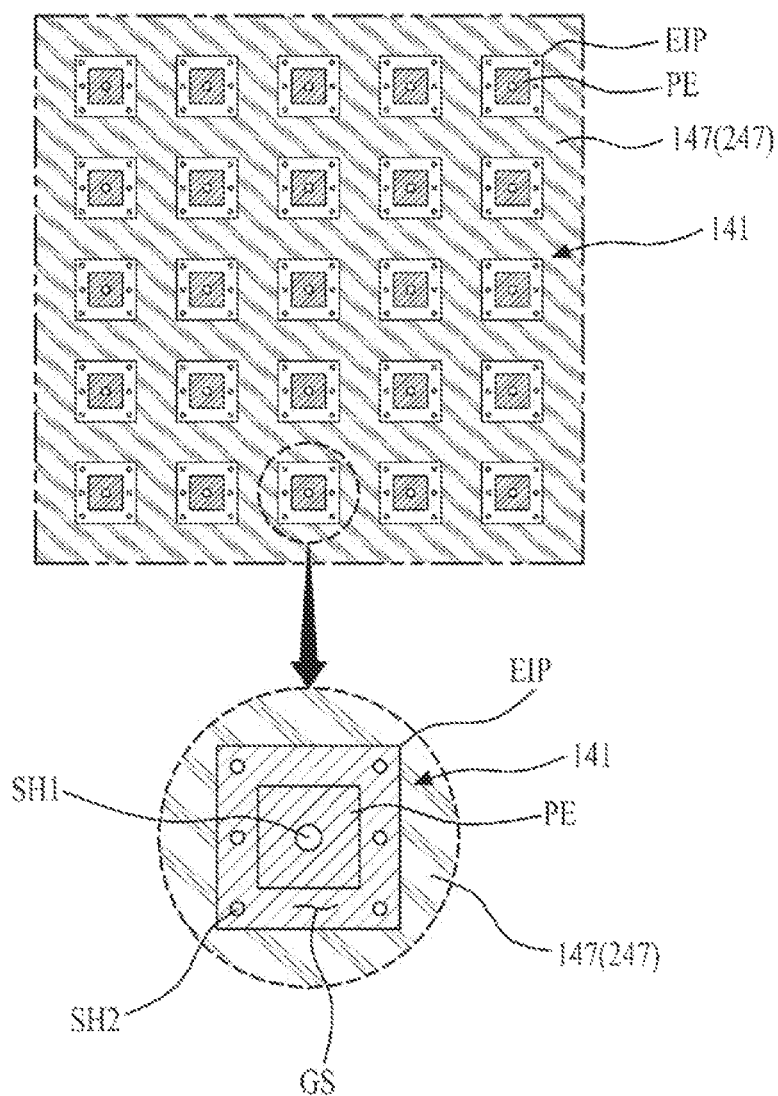
FIG. 7 illustrates a second arrangement structure of plasma discharging cells according to the embodiment of the present invention.

First, as shown in FIG. 6 or 7, the plurality of plasma discharge cells 141 confronting the upper surface of the substrate (S) may be arranged in the lattice configuration of 'n×m' inside the lower frame 147. Each of the plasma discharge cells 141 may include the protruding electrode (PE) which protrudes out of the lower surface of the upper frame 143 and has the circular or square cross section, and the electrode inserting portion (EIP) whose cross sectional shape is the same as that of the protruding electrode (PE), wherein the electrode inserting portion (EIP) is formed in the lower frame 147, and is provided to surround the protruding electrode (PE) with the gap space (GS) interposed in-between. That is, the plurality of electrode inserting portions (EIP) and the plurality of protruding electrodes (PE) respectively inserted into the electrode inserting portions (EIP) are arranged in the lattice configuration of 'n×m'. The aforementioned processing gas distribution hole (SH1) is formed in the center of each protruding electrode (PE) in each of the plurality of plasma discharge cells 141, and the aforementioned dilution gas distribution hole (SH2) is formed in the gap space (GS) for each of the plurality of plasma discharge cells 141. For example, the two of dilution gas distribution holes (SH2) are formed in each of both gap spaces (GS) of the protruding electrode (PE) with respect to the processing gas distribution hole (SH1).

Figure 8:
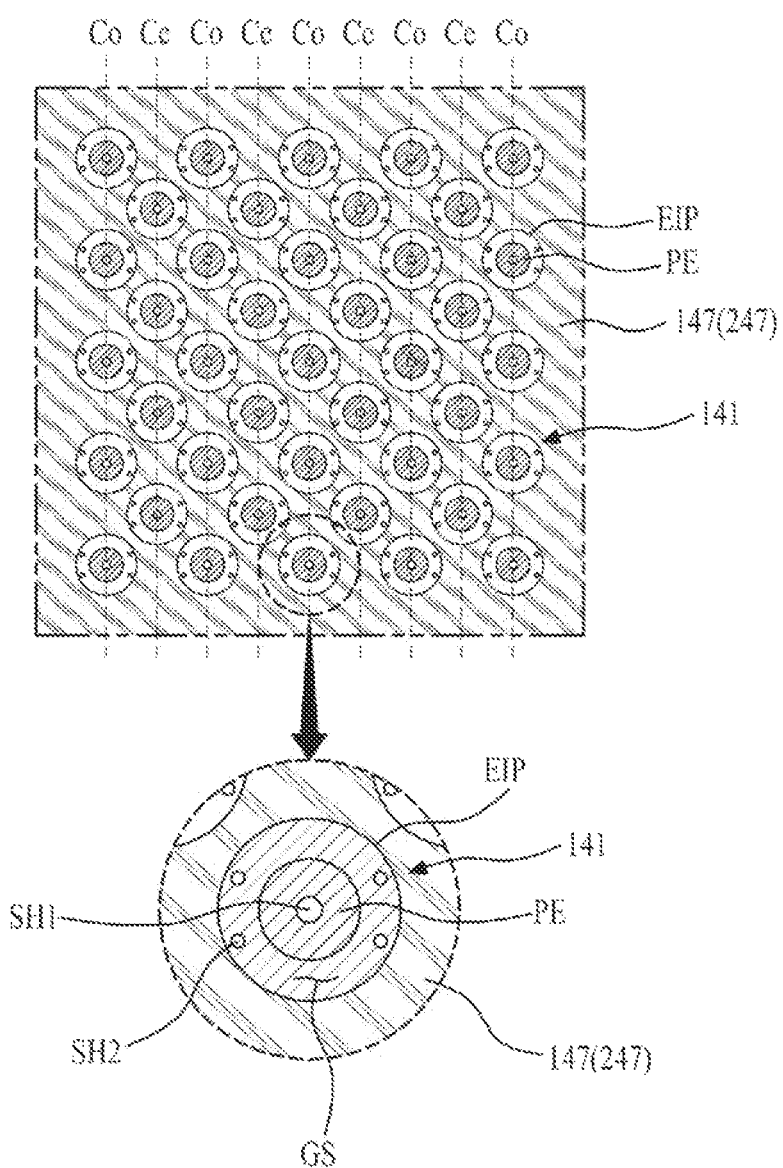
FIG. 8 illustrates a third arrangement structure of plasma discharging cells according to the embodiment of the present invention.
Figure 9:
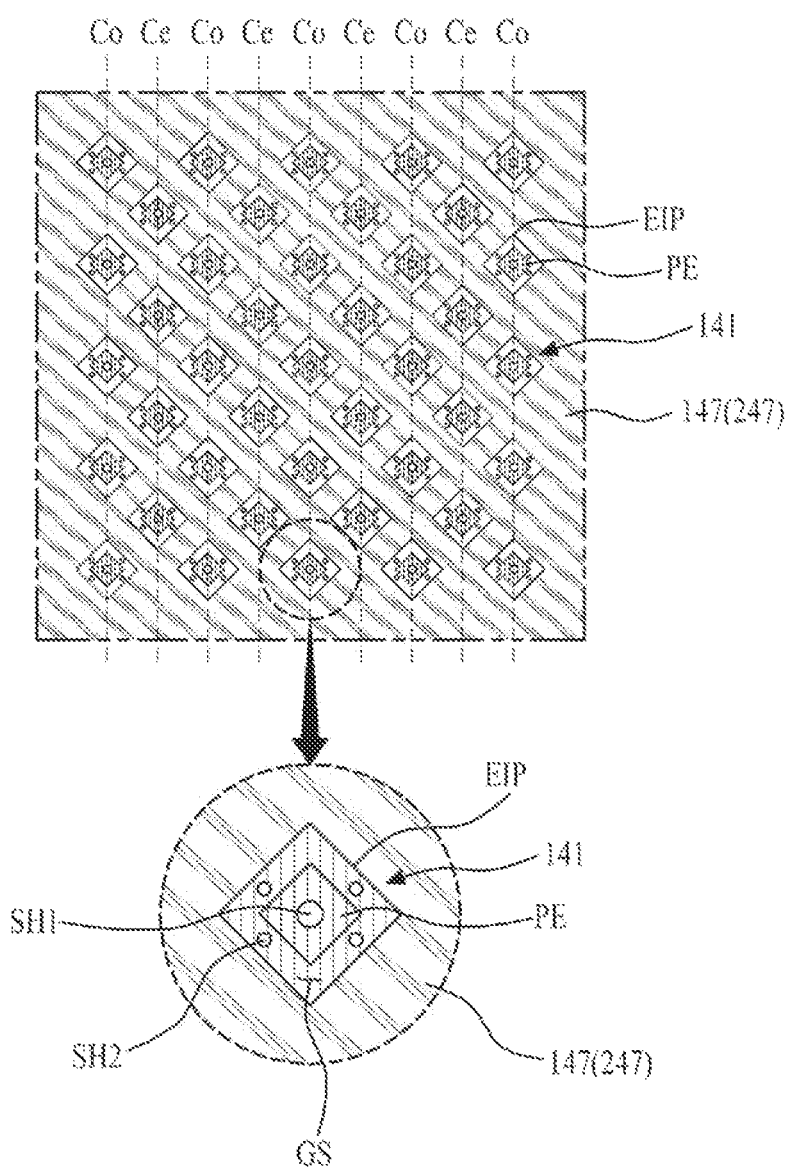
FIG. 9 illustrates a fourth arrangement structure of plasma discharging cells according to the embodiment of the present invention.
Figure 10:
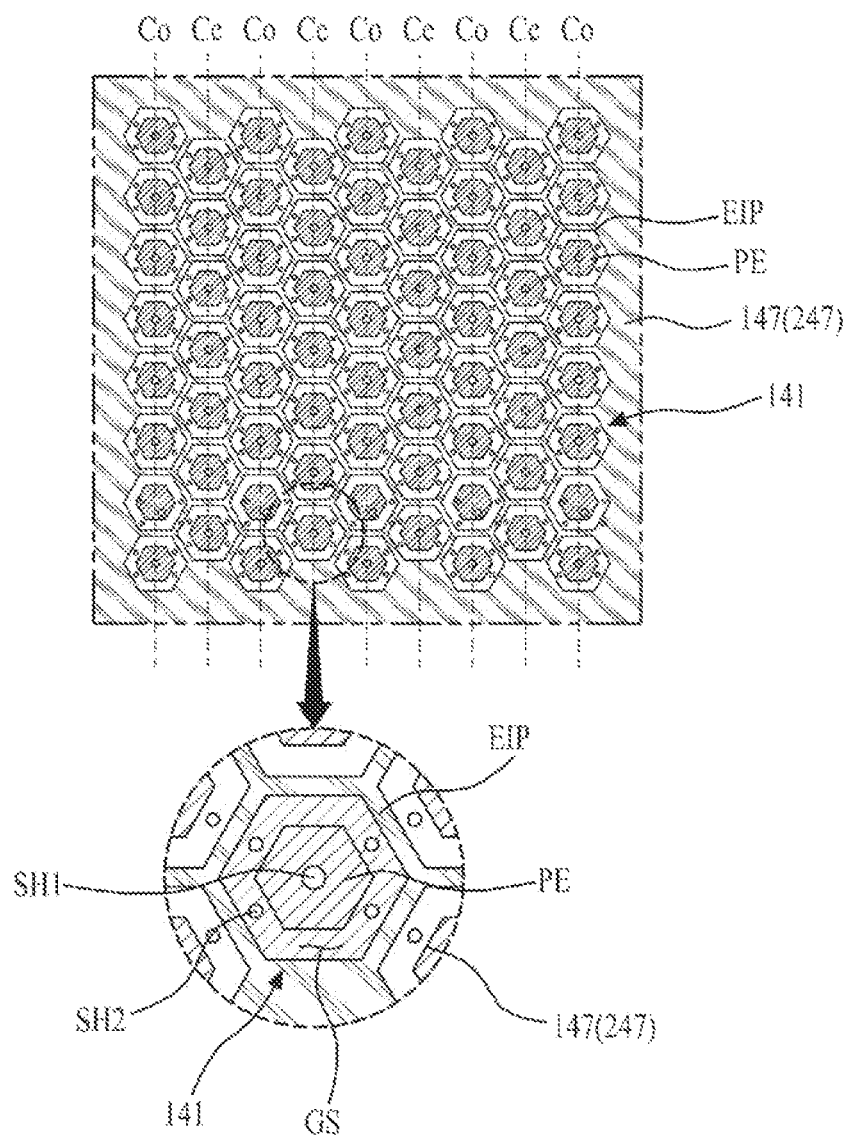
FIG. 10 illustrates a fifth arrangement structure of plasma discharging cells according to the embodiment of the present invention.

As shown in FIG. 8, 9 or 10, the plurality of plasma discharge cells 141 confronting the upper surface of the substrate (S) may be arranged in a zigzag or honeycomb configuration inside the lower frame 147. Each of the plasma discharge cells 141 may include the protruding electrode (PE) which protrudes out of the lower surface of the upper frame 143 and have the cross sectional shape of circle, diamond or hexagon, and the electrode inserting portion (EIP) whose cross sectional shape is the same as that of the protruding electrode (PE), wherein the electrode inserting portion (EIP) is formed in the lower frame 147, and is provided to surround the protruding electrode (PE) with the gap space (GS) interposed in-between. That is, the plurality of electrode inserting portions (EIP), into which the plurality of protruding electrodes (PE) are inserted, are arranged at fixed intervals in each of 'n' columns, wherein the plurality of electrode inserting portions (EIP) arranged in the odd-numbered column (Co) and the even-numbered column (Ce) are staggered. The aforementioned processing gas distribution hole (SH1) is formed in the center of each protruding electrode (PE) in each of the plurality of plasma discharge cells 141, and the plurality of dilution gas distribution holes (SH2) are formed in the gap space (GS) for each of the plurality of plasma discharge cells 141. For example, the two of dilution gas distribution holes (SH2) are formed in each of both gap spaces (GS) of the protruding electrode (PE) with respect to the processing gas distribution hole (SH1).

In each of the plurality of plasma discharge cells 141, it is preferable that the interval between each of the neighboring electrode inserting portions (EIP) be minimum. In the drawings, the two or three of the dilution gas distribution holes (SH2) are formed in each of both gap spaces (GS) of the protruding electrode (PE) with respect to the processing gas distribution hole (SH1), but not limited to this structure. In consideration of shape and size of the electrode inserting portion (EIP) and a width of the gap space (GS), the two or more dilution gas distribution holes (SH2) may be formed in the gap space (GS) for each of the plurality of plasma discharge cells 141.

Figure 11:
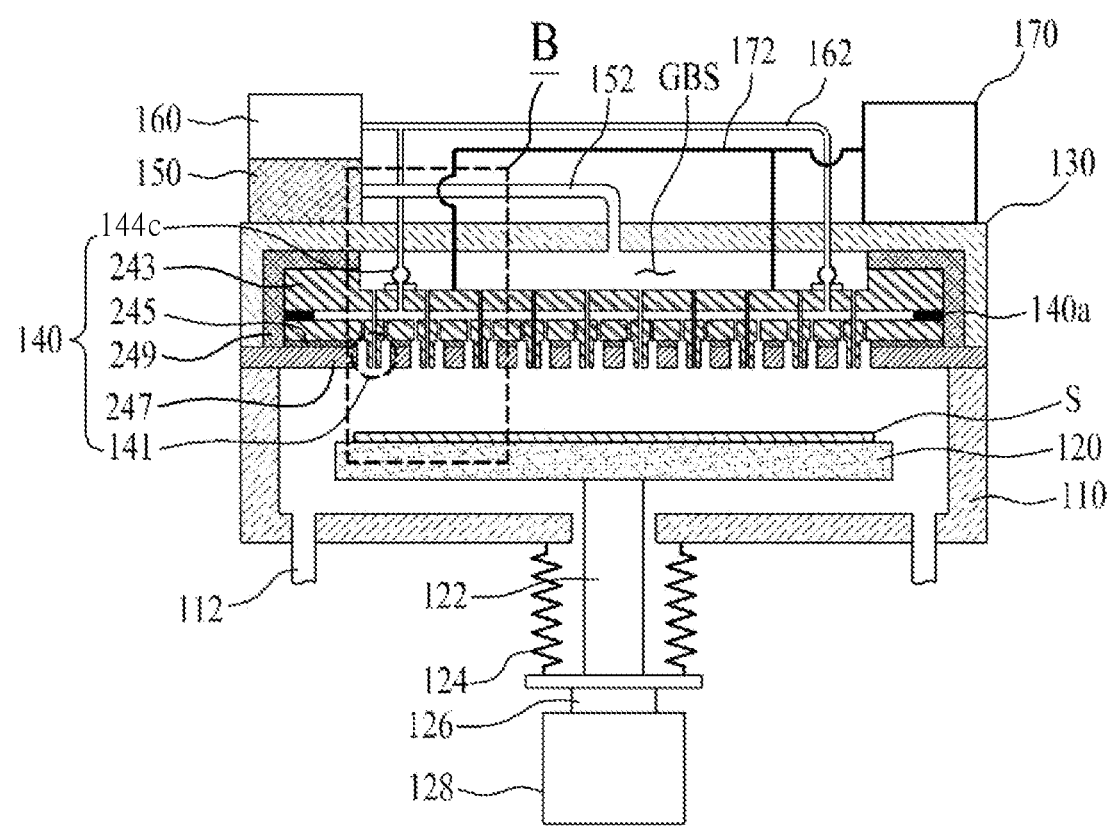
FIG. 11 illustrates a substrate processing apparatus according to the second embodiment of the present invention.
Figure 12:
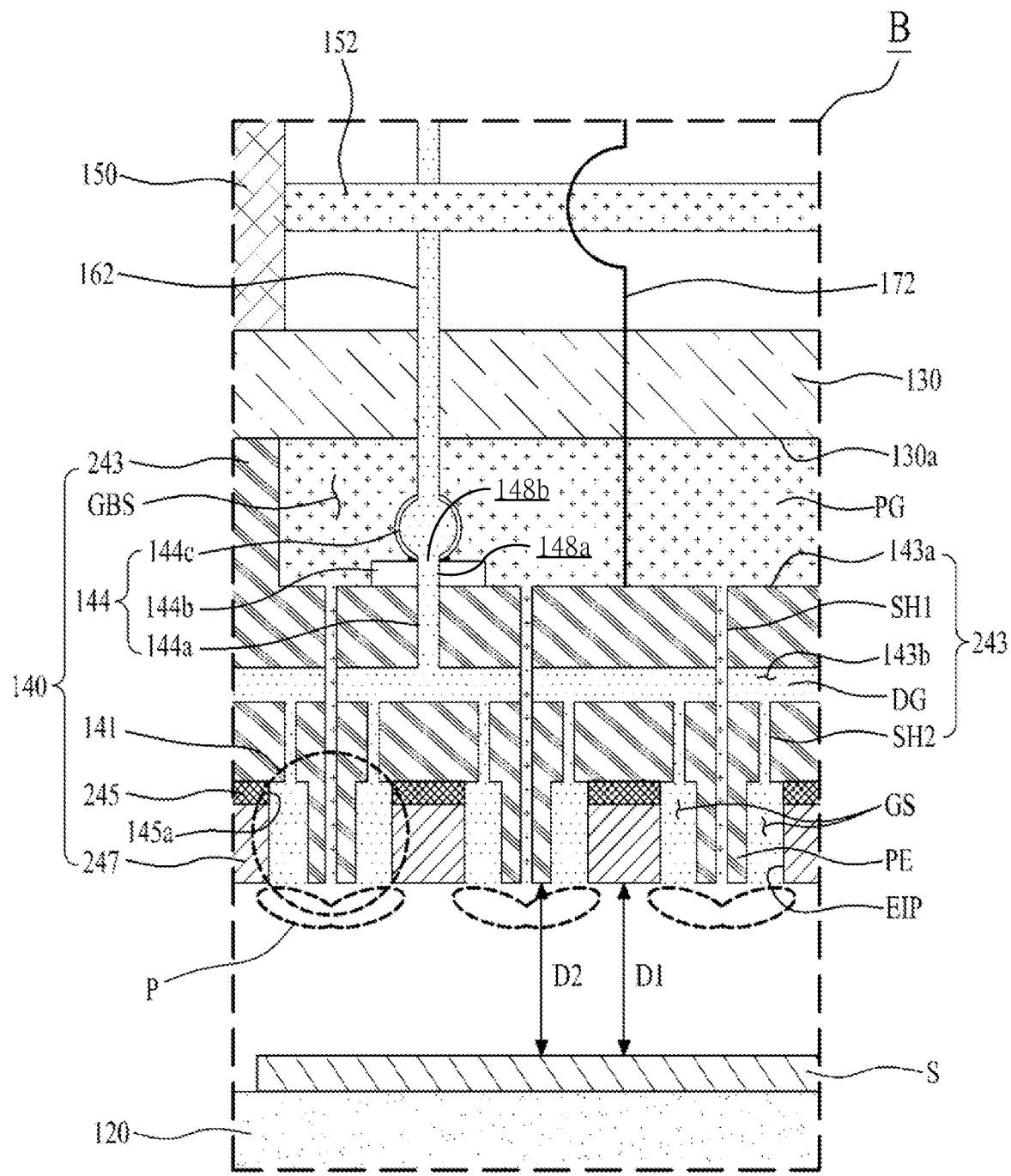
FIG. 12 is an expanded view illustrating 'B' portion shown in FIG. 11.

FIG. 11 illustrates a substrate processing apparatus according to the second embodiment of the present invention. FIG. 12 is an expanded view illustrating 'B' portion shown in FIG. 11.

Referring to FIGS. 11 and 12, the substrate processing apparatus according to the second embodiment of the present invention may include a process chamber 110, a substrate supporter 120, a chamber lid 130, and a gas distribution module 140. The gas distribution module 140 may include an upper frame 243, a plurality of dilution gas common supply members 144, an insulating plate 245, a lower frame 247, and an insulating frame 249. In the substrate processing apparatus according to the second embodiment of the present invention, plasma power is applied to the upper frame 243 of the gas distribution module 140, and the lower frame 247 is electrically grounded. Hereinafter, only different structures of the substrate processing apparatus according to the second embodiment of the present invention will be described as follows.

First, the upper frame 243 is detachably connected with a lower surface 130a of the chamber lid 130, and is provided at a predetermined interval from the lower surface 130a of the chamber lid 130. Accordingly, a processing gas buffer space (GBS) is prepared between an upper surface 143a of the upper frame 243 and the lower surface 130a of the chamber lid 130, wherein processing gas (PG) supplied from a first gas supplier 150 through a first gas supply pipe 152 is diffused and buffered in the processing gas buffer space (GBS). To this end, the upper surface 143a of the upper frame 243 may have a stepped portion provided at a predetermined interval from the lower surface 130a of the chamber lid 130. The upper frame 243 may be formed of a metal material such as aluminum (Al), whereby the upper frame 243 may be electrically insulated from the chamber lid 130 by the insulating frame 249.

The upper frame 143 may include a plurality of protruding electrodes (PE), a plurality of processing gas distribution holes (SH1), a plurality of dilution gas supply holes 143b, and a plurality of dilution gas distribution holes (SH2). The upper frame 243 is similar to that of the upper frame 143 shown in FIGS. 2 and 3 except that the plurality of protruding electrodes (PE) included in the upper frame 143 of FIGS. 2 and 3 are used as the plasma electrode applied with the plasma power, whereby a detailed description for the upper frame 243 will be omitted.

The insulating plate 245 is detachably connected with the lower surface of the upper frame 243 so as to cover the remaining lower surface areas of the upper frame 243 except the plurality of protruding electrodes (PE) and the plurality of dilution gas distribution holes (SH2). In this case, the insulating plate 245 is provided with a plurality of electrode penetrating portions 145a. The plurality of protruding electrodes (PE), which protrude from the lower surface of the upper frame 243, are respectively inserted into the plurality of electrode penetrating portions 145a, and then penetrate through the plurality of electrode penetrating portions 145a. Each of the electrode penetrating portions 145a, formed in a circle or polygonal shape which is the same as that of the protruding electrode (PE), surrounds the protruding electrode (PE). The insulating plate 245 is formed of an insulating material, for example, ceramic material, to thereby electrically insulate the upper frame 243 and the lower frame 247 from each other.

The lower frame 247 is provided with a plurality of electrode inserting portions (EIP) into which the plurality of protruding electrodes (PE) penetrating through the electrode penetrating portions 145a of the insulating plate 245 are inserted, and the lower frame 247 is detachably connected with the lower surface of the insulating plate 245. Except that the lower frame 247 is electrically grounded to the process chamber 110, the lower frame 247 is identical to the lower frame 147 shown in FIGS. 2 and 3, whereby a detailed description for the lower frame 247 will be substituted by the aforementioned description of the lower frame 147.

Meanwhile, the plurality of plasma discharge cells 141 prepared inside the lower frame 247 by the combination of the electrode inserting portions (EIP) and the protruding electrodes (PE) may be arranged in any of the configurations shown in FIGS. 6 to 10.

The insulating frame 249 is connected with an upper edge and each side of the lower frame 247, and is detachably connected with a lower surface and an inner side of the chamber lid 130. The insulating frame 249 is formed of an insulating material, for example, ceramic material, to thereby electrically insulate the chamber lid 130 and the lower frame 247 from each other.

The aforementioned upper frame 243, the insulating plate 245 and the lower frame 247 are formed as one module, which are detachably connected with the lower surface of the chamber lid 130.

Except that the upper frame 243 is used as a plasma electrode and the lower frame 247 is used as a ground electrode, the substrate processing method for forming the thin film on the substrate (S) by the use of substrate processing apparatus according to the second embodiment of the present invention is the same as the substrate processing method for forming the thin film on the substrate (S) by the use of substrate processing apparatus according to the first embodiment of the present invention, whereby a detailed description for the substrate processing method using the substrate processing apparatus according to the second embodiment of the present invention will be omitted.

In the substrate processing apparatus and method according to the second embodiment of the present invention, the processing gas (PG) is dissociated by the plasma (P) which occurs in each of the plurality of plasma discharge cells 141 arranged in the predetermined configuration inside the lower frame 247, and is distributed onto the substrate (S) so that it is possible to achieve the same effects as those of the first embodiment of the present invention. The distance between the upper frame 243 used as the plasma electrode and the substrate (S) becomes larger, whereby it is possible to minimize the mutual influence between the substrate (S) and the upper frame 243 used as the plasma electrode, thereby improving quality of the thin film formed on the substrate (S).

In the substrate processing apparatus and method according to the second embodiment of the present invention, the processing gas (PG) is dissociated by the plasma (P) which occurs in each of the plurality of plasma discharge cells 141 arranged in the predetermined configuration inside the lower frame 247, and is distributed onto the substrate (S) so that it is possible to form the thin film with the uniform thickness on the entire upper surface of the substrate (S).

In addition, it is possible to prevent the plasma discharge from being transferred to the substrate (S), to thereby minimize damages on the substrate (S) and the thin film formed on the substrate (S), and minimize deterioration in quality of the thin film. Furthermore, the processing gas (PG) and the dilution gas (DG) are separated from each other so that it is possible to minimize the abnormal thin film on the inside wall of the gas distribution module, that is, the inner wall of the electrode inserting portion (EIP) and the protruding electrode (PE), to thereby extend the time of cleaning cycle for the gas distribution module.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing apparatus comprising:
   a process chamber that provides a reaction space;
   a single gas distribution module that distributes a processing gas onto a substrate; and
   a chamber lid that covers the process chamber, wherein:
   the single gas distribution module is detachably connected with a lower surface of the chamber lid,
   the single gas distribution module is in the process chamber and includes a lower frame, an upper frame, and an insulating plate between the lower frame and the upper frame, the insulating plate having a plurality of electrode penetrating portions, and a processing gas buffer space is between an upper surface of the upper frame and the lower surface of the chamber lid;
   the upper frame includes:
   a plurality of protruding electrodes that protrude from a lower surface of the upper frame toward the substrate, each of the protruding electrodes having an outer lateral surface;
   a plurality of processing gas distribution holes that penetrate through the plurality of protruding electrodes and downwardly distribute the processing gas from the processing gas buffer space to a lower surface of the plurality of protruding electrodes;
a plurality of dilution gas division holes in the upper frame in communication with a plurality of dilution gas common supply pipes;
a plurality of dilution gas supply holes inside the upper frame and in communication with the plurality of dilution gas division holes; and
a plurality of dilution gas distribution holes at fixed intervals in the upper frame and receiving the dilution gas from the plurality of dilution gas supply holes, wherein each of the plurality of protruding electrodes is between at least two of the plurality of dilution gas distribution holes,
the lower frame includes a plurality of electrode inserting portions, each of the electrode inserting portions having an inner lateral surface;
the plurality of protruding electrodes are in and penetrate through the electrode penetrating portions, and the inner lateral surface of each of the electrode inserting portions and the outer lateral surface of a corresponding one of the protruding electrodes therein defines a gap space, whereby the plurality of dilution gas distribution holes distribute a dilution gas to the gap spaces around the protruding electrodes;
the upper frame is electrically grounded;
the plurality of dilution gas common supply pipes are in the processing gas buffer space;
the substrate processing apparatus further comprises a plasma power supplier that supplies power to the lower frame; and
the substrate processing apparatus generates a plasma in or below the gap space using the dilution gas from the plurality of dilution gas distribution holes.

2. The substrate processing apparatus according to claim 1, wherein each of the electrode inserting portions and each of the protruding electrodes has a same shape.

3. The substrate processing apparatus according to claim 2, wherein the same shape of each of the electrode inserting portions and each of the protruding electrodes is circular or polygonal.

4. The substrate processing apparatus according to claim 1, wherein the plurality of electrode inserting portions have a lattice or zigzag configuration, and face an upper surface of the substrate.

5. The substrate processing apparatus according to claim 1, wherein a first distance between a lower surface of the lower frame and an upper surface of the substrate is different from a second distance between the lower surface of the plurality of protruding electrodes and the upper surface of the substrate.

6. The substrate processing apparatus according to claim 5, wherein each of the plurality of protruding electrodes has a different length.

7. The substrate processing apparatus according to claim 1, wherein the dilution gas comprises hydrogen ($H_2$), nitrogen ($N_2$), oxygen ($O_2$), nitrogen dioxide ($NO_2$), ammonia ($NH_3$), water ($H_2$), or ozone ($O_3$).

8. The substrate processing apparatus according to claim 1, wherein each of the plurality of protruding electrodes has a circular or polygonal cross section.

9. The substrate processing apparatus according to claim 1, wherein the processing gas includes a material comprising silicon, titanium, zirconium, hafnium, or aluminum.

10. A substrate processing apparatus comprising:
a process chamber that provides a reaction space; and
a single gas distribution module that distributes a processing gas onto a substrate; and
a chamber lid that covers the process chamber, wherein the single gas distribution module is detachably connected with a lower surface of the chamber lid, and:
the single gas distribution module is in the process chamber and includes a lower frame and an upper frame, such that a processing gas buffer space is between an upper surface of the upper frame and the lower surface of the chamber lid;
the upper frame includes:
a plurality of protruding electrodes that protrude from a lower surface of the upper frame toward the substrate, each of the protruding electrodes having an outer lateral surface;
a plurality of processing gas distribution holes that penetrate through the plurality of protruding electrodes and downwardly distribute the processing gas from the processing gas buffer space to a lower surface of the plurality of protruding electrodes;
a plurality of dilution gas division holes in the upper frame in communication with the plurality of dilution gas common supply pipes;
a plurality of dilution gas supply holes in the upper frame and in communication with the plurality of dilution gas division holes; and
a plurality of dilution gas distribution holes at fixed intervals in the upper frame and receiving the dilution gas from the plurality of dilution gas supply holes, wherein each of the plurality of protruding electrodes is between at least two of the plurality of dilution gas distribution holes,
the lower frame includes a plurality of electrode inserting portions, each of the electrode inserting portions having an inner lateral surface;
the plurality of protruding electrodes are in the plurality of electrode inserting portions, and the inner lateral surface of each of the electrode inserting portions and the outer lateral surface of a corresponding one of the protruding electrodes therein defines a gap space, whereby the plurality of dilution gas distribution holes distribute a dilution gas to the gap spaces around the protruding electrodes;
the upper frame is electrically grounded;
the plurality of dilution gas common supply pipes are in the processing gas buffer space;
the substrate processing apparatus further comprises a plasma power supplier that supplies power to the lower frame,
the substrate processing apparatus generates a plasma in or below the gap space using the dilution gas from the dilution gas distribution holes; and
the plurality of electrode inserting portions are at fixed intervals and are alternatingly staggered in each of n columns, wherein the n columns comprise odd-numbered columns and even-numbered columns.

11. The substrate processing apparatus according to claim 10, wherein each of the electrode inserting portions and each of the protruding electrodes has a same shape, and the same shape is circular or polygonal.

12. The substrate processing apparatus according to claim 10, wherein the plurality of electrode inserting portions have a lattice or zigzag configuration, and face an upper surface of the substrate.

13. The substrate processing apparatus according to claim 10, wherein a first distance between a lower surface of the lower frame and an upper surface of the substrate is different from a second distance between the lower surface of the plurality of protruding electrodes and the upper surface of the substrate.

14. The substrate processing apparatus according to claim 10, wherein the dilution gas comprises hydrogen ($H_2$), nitrogen ($N_2$), oxygen ($O_2$), nitrogen dioxide ($NO_2$), ammonia ($NH_3$), water ($H_2$), or ozone ($O_3$).

15. The substrate processing apparatus according to claim 14, wherein the processing gas includes a material comprising silicon, titanium, zirconium, hafnium, or aluminum.

16. The substrate processing apparatus according to claim 10, wherein the even-numbered columns are offset from the odd-numbered columns.

17. The substrate processing apparatus according to claim 1, further comprising at least one common block on the upper surface of the upper frame, configured to seal the plurality of dilution gas division holes, wherein the at least one common block includes a plurality of communication holes that communicate with the plurality of dilution gas common supply pipes and the dilution gas division holes.

18. The substrate processing apparatus according to claim 17, wherein the plurality of communication holes communicate with respective ones of the plurality of dilution gas division holes, and each of the plurality of dilution gas common supply pipes has a lower surface with a plurality of lower holes therein that communicate with respective ones of the plurality of communication holes.

19. The substrate processing apparatus according to claim 10, further comprising at least one common block on the upper surface of the upper frame, configured to seal the plurality of dilution gas division holes, wherein the at least one common block includes a plurality of communication holes that communicate with the plurality of dilution gas common supply pipes and the dilution gas division holes.

20. The substrate processing apparatus according to claim 19, wherein the plurality of communication holes communicate with respective ones of the plurality of dilution gas division holes, and each of the plurality of dilution gas common supply pipes has a lower surface with a plurality of lower holes therein that communicate with respective ones of the plurality of communication holes.

* * * * *